(12) United States Patent
Hong et al.

(10) Patent No.: US 11,565,354 B2
(45) Date of Patent: Jan. 31, 2023

(54) STAGE FOR CUTTING SUBSTRATE AND SUBSTRATE CUTTING DEVICE

(71) Applicant: SAMSUNG DISPLAY CO., LTD., Yongin-Si (KR)

(72) Inventors: Kyongho Hong, Hwaseong-si (KR); Jinwon Baek, Hwaseong-si (KR); Jeongho Yi, Suwon-si (KR); Jinpyung Lee, Pohang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

(21) Appl. No.: 16/248,505

(22) Filed: Jan. 15, 2019

(65) Prior Publication Data

US 2019/0217427 A1 Jul. 18, 2019

(30) Foreign Application Priority Data

Jan. 18, 2018 (KR) .................... 10-2018-0006728

(51) Int. Cl.
 *B23K 37/04* (2006.01)
 *B25B 11/00* (2006.01)
 (Continued)

(52) U.S. Cl.
 CPC .......... *B23K 37/0408* (2013.01); *B23K 26/38* (2013.01); *B23Q 1/015* (2013.01);
 (Continued)

(58) Field of Classification Search
 CPC .. B23K 26/142; B23K 37/0408; B23K 26/38; B23K 2101/40; B23Q 1/015;
 (Continued)

(56) References Cited

U.S. PATENT DOCUMENTS

| 5,922,225 A * | 7/1999 | Blake ................... B23K 26/142 |
| | | 219/121.84 |
| 2017/0120379 A1 * | 5/2017 | Choi ...................... B23K 26/38 |
| 2018/0133838 A1 * | 5/2018 | Summerer ........... B23K 26/083 |

FOREIGN PATENT DOCUMENTS

| KR | 10-2009-0122534 A | 12/2009 |
| KR | 20090122534 A * | 12/2009 |

(Continued)

OTHER PUBLICATIONS

Machine English Translation of KR-20090122534-A (Year: 2009).*

(Continued)

*Primary Examiner* — Sang Y Paik
*Assistant Examiner* — Erwin J Wunderlich
(74) *Attorney, Agent, or Firm* — Lewis Roca Rothgerber Christie LLP

(57) ABSTRACT

A stage for cutting a substrate includes: a body member; a plurality of first discharging members, each including a first suction portion in the body member and a first partition wall portion connected to the first suction portion and protruding from a top surface of the body member, each of the first discharging members defining a first space connected to an outside; a plurality of second discharging members, each including a second suction portion in the body member and a second partition wall portion connected to the second suction portion and protruding from the top surface of the body member, each of the second discharging members defining a second space connected to the outside; a plurality of connecting pipes each connected to the first partition wall portion and the second partition wall portion; and a plurality of supply pipes connected to the connecting pipes.

14 Claims, 10 Drawing Sheets

(51) Int. Cl.
  *B23K 26/38* (2014.01)
  *B23Q 11/00* (2006.01)
  *B23Q 1/01* (2006.01)
  *H01L 21/67* (2006.01)
  *H01L 21/683* (2006.01)
  *B23K 101/40* (2006.01)

(52) U.S. Cl.
  CPC ........ *B23Q 11/0046* (2013.01); *B25B 11/005* (2013.01); *H01L 21/67017* (2013.01); *H01L 21/67092* (2013.01); *H01L 21/683* (2013.01); *B23K 2101/40* (2018.08)

(58) Field of Classification Search
  CPC .............. B23Q 11/0046; B25B 11/005; H01L 21/67017; H01L 21/683; H01L 21/67092
  USPC .................................................... 219/121.67
  See application file for complete search history.

(56) References Cited

FOREIGN PATENT DOCUMENTS

| | | | |
|---|---|---|---|
| KR | 10-2010-0095673 A | 9/2010 | |
| KR | 10-2016-0051470 A | 5/2016 | |
| KR | 10-2017-0051598 A | 5/2017 | |
| KR | 10-2017-0052168 A | 5/2017 | |
| KR | 20170051598 A * | 5/2017 | ......... H01L 21/6838 |
| KR | 10-2017-0111684 A | 10/2017 | |
| KR | 10-2018-0002959 | 1/2018 | |

OTHER PUBLICATIONS

Machine English Translation of KR-20170051598-A (Year: 2017).*
Korean Notice of Allowance dated Mar. 15, 2022 issued in corresponding KR Application No. 10-2018-0006728, 2 pages.
Korean Notice of Allowance dated Mar. 15, 2022 issued in corresponding KR Application No. 10-2018-0006728, 5 pages.

* cited by examiner

STAGE FOR CUTTING SUBSTRATE AND SUBSTRATE CUTTING DEVICE

CROSS-REFERENCE TO RELATED APPLICATION

This application claims priority to and the benefit of Korean Patent Application No. 10-2018-0006728, filed on Jan. 18, 2018 in the Korean Intellectual Property Office, the entire content of which is herein incorporated by reference.

BACKGROUND

1. Field

Aspects of embodiments of the present disclosure relate to a cutting device, and more particularly, to a stage for cutting a substrate and a substrate cutting device.

2. Description of the Related Art

Typically, a display device may include any of an organic light emitting display (OLED), a liquid crystal display (LCD), an electrophoretic display (ED), a surface-conduction electron emitter display (SED), and a vacuum fluorescent display (VFD).

The display device may be used for mobile devices, such as smartphones, tablet personal computers, laptop computers, digital cameras, camcorders, and portable information terminals and electronic products, such as slim-type televisions, demonstration displays, and advertising boards.

In recent years, research for manufacturing a more slim display device has been progressing. Among the display devices, a flexible display device has attracted much attention as a next generation display device in order to easily carry out and be applied to devices having various shapes. Among the flexible display devices, a flexible display device based on an organic light emitting display technology has been the most promising display device.

Also, the display device may undergo a cutting process. During the cutting process, it is desirable that foreign substances generated on a substrate be easily removed.

SUMMARY

According to aspects of embodiments of the present disclosure, a stage for cutting a substrate that is capable of effectively removing foreign substances generated in a process of cutting a substrate, and a substrate cutting device, are provided.

According to one or more embodiments of the present disclosure, a stage for cutting a substrate includes: a body member on which a plurality of cell areas are defined; a plurality of first discharging members extending in a first direction and arranged by a distance from each other in a second direction crossing the first direction, each including a first suction portion in the body member and a first partition wall portion connected to the first suction portion and protruding from a top surface of the body member, each of the first discharging members defining a first space connected to an outside; a plurality of second discharging members extending in the second direction and arranged by a distance from each other in the first direction, each including a second suction portion in the body member and a second partition wall portion connected to the second suction portion and protruding from the top surface of the body member, each of the second discharging members defining a second space connected to the outside; a plurality of connecting pipes in the cell areas, respectively, and each of which is connected to the first partition wall portion and the second partition wall portion; and a plurality of supply pipes connected to the connecting pipes while being in the body member and configured to supply air to each of the first spaces of the first discharging members and the second spaces of the second discharging members through the connecting pipes.

In an embodiment, each of the connecting pipes may include: a first connecting pipe and a second connecting pipe, which are spaced apart from each other in the first direction and each of which is connected to two partition wall portions, which are adjacent to each other, among the first partition wall portions of the first discharging members; and a third connecting pipe and a fourth connecting pipe, which are spaced apart from each other in the second direction and each of which is connected to two partition wall portions, which are adjacent to each other, among the second partition wall portions of the second discharging members.

In an embodiment, each of the supply pipes may be connected to at least one of the third connecting pipe and the fourth connecting pipe.

In an embodiment, air may be circulated through all of the first to fourth connecting pipes.

In an embodiment, the stage may further include a plurality of vacuum stages on the body member and overlapping the cell areas, respectively.

In an embodiment, on a plane, each of the vacuum stages may be surrounded by the first to fourth connecting pipes of a corresponding connecting pipe of the plurality of connecting pipes.

In an embodiment, in a thickness direction of the body member, each of the vacuum stages may have a height greater than that of each of the first partition wall portions and the second partition wall portions.

In an embodiment, each of the vacuum stages may include a plurality of vacuum holes.

In an embodiment, the stage may further include a plurality of first sub-connecting pipes connecting the first connecting pipe and one partition wall portion of the two partition wall portions, which is connected to the third connecting pipe and the fourth connecting pipe; and a plurality of second sub-connecting pipes connecting the second connecting pipe and the other partition wall portion of the two partition wall portions, which is connected to the third connecting pipe and the fourth connecting pipe.

In an embodiment, the stage may further include a plurality of third sub-connecting pipes connecting the third connecting pipe and one partition wall portion of the two partition wall portions, which is connected to the first connecting pipe and the second connecting pipe; and a plurality of fourth sub-connecting pipes connecting the fourth connecting pipe and the other partition wall portion of the two partition wall portions, which is connected to the first connecting pipe and the second connecting pipe.

In an embodiment, the first partition wall portions may include a first partition wall and a second partition wall, which are connected to the first suction portion and spaced apart from each other with the first space therebetween.

In an embodiment, the first partition wall may include at least one hole connected to a first connecting pipe of the connecting pipes, and the second partition wall may include at least one hole connected to a second connecting pipe of the connecting pipes, which is adjacent to the first connecting pipe in the second direction.

In an embodiment, the supply pipes may extend in the first direction and be spaced a distance from each other in the second direction.

In an embodiment, connecting pipes arranged in the first direction among the connecting pipes may define a first connecting pipe group and a second connecting pipe group, each of the supply pipes may include a first supply pipe and a second supply pipe, and the first supply pipe may be connected to the first connecting pipe group, and the second supply pipe may be connected to the second connecting pipe group.

In an embodiment, the supply pipes may be connected to the connecting pipes through at least two areas, respectively.

In an embodiment, each of the supply pipes may be located between two discharging members, which are adjacent to each other, of the first discharging members.

According to one or more embodiments of the present disclosure, a substrate cutting device includes: a stage on which a substrate is arrangeable; a laser module configured to irradiate a laser to the substrate; a suction member connected to the stage; and an air supply member connected to the stage. The stage may include: a body member, on which a plurality of cell areas are defined; a plurality of first discharging members extending in a first direction and arranged by a distance from each other in a second direction crossing the first direction, each including a first suction portion in the body member and a first partition wall portion connected to the first suction portion and protruding from a top surface of the body member, each of the first discharging members defining a first space connected to an outside; a plurality of second discharging members extending in the second direction and arranged by a distance from each other in the first direction, each including a second suction portion in the body member and a second partition wall portion connected to the second suction portion and protruding from the top surface of the body member, each of the second discharging members defining a second space connected to the outside; a plurality of connecting pipes in the cell areas, respectively, and each connected to the first partition wall portion and the second partition wall portion; and a plurality of supply pipes connected to the connecting pipes and being in the body member and configured to supply air to each of the first spaces of the first discharging members and the second spaces of the second discharging members through the connecting pipes.

In an embodiment, the suction member may include a plurality of suction parts connected to the first discharging members, respectively.

In an embodiment, the air supply member may include a plurality of air supply parts connected to the supply pipes, respectively.

In an embodiment, the stage may further include a plurality of vacuum stages on the body member and overlapping the cell areas, respectively.

BRIEF DESCRIPTION OF THE FIGURES

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

Figure 1:
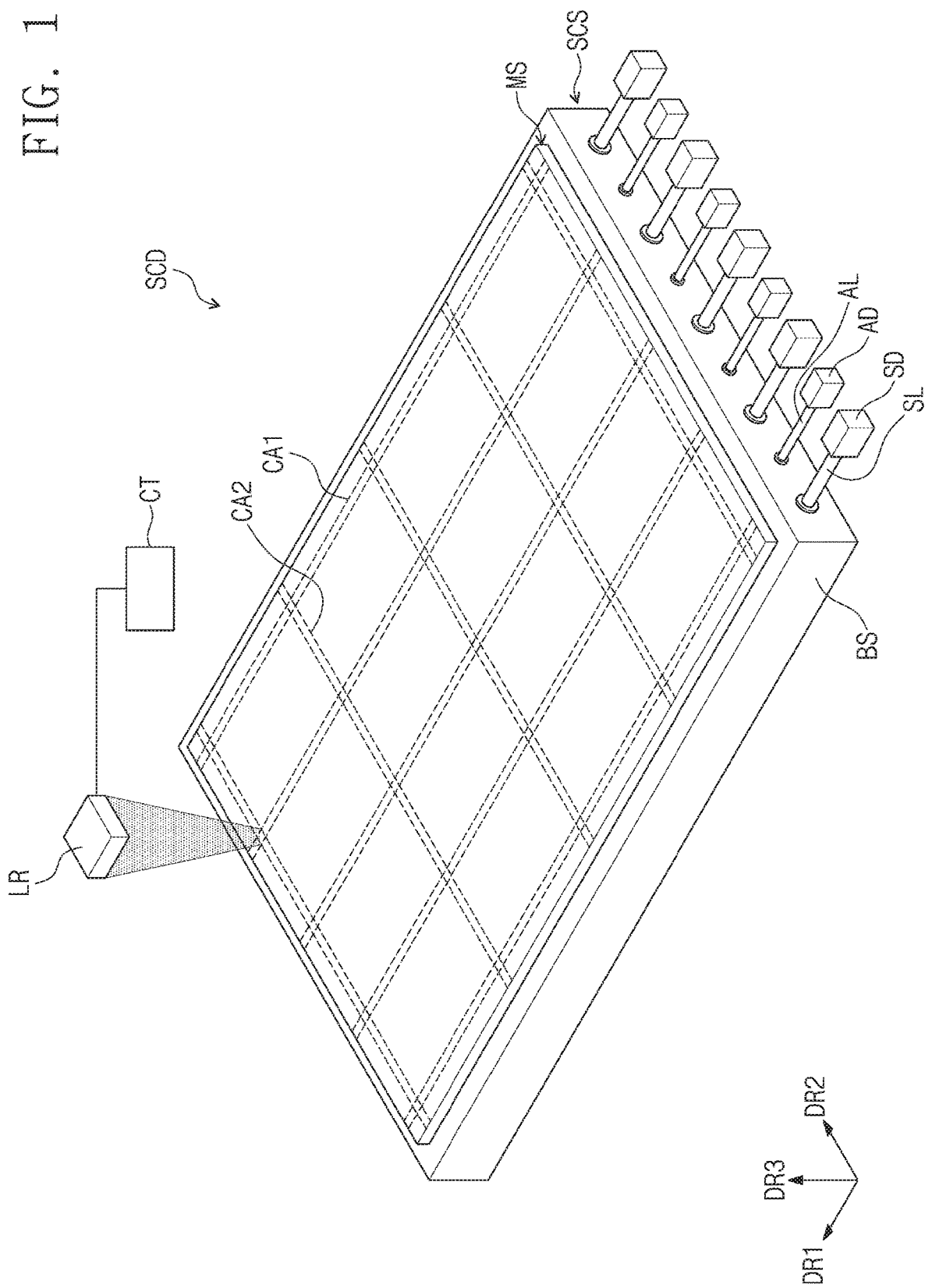
FIG. 1 is a perspective view illustrating a substrate cutting device according to an embodiment of the inventive concept.

The present disclosure may have diverse and modified embodiments, although some specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the present disclosure.

Like reference numerals refer to like elements throughout. In the figures, the dimensions of layers and regions may be exaggerated for clarity of illustration. It is to be understood that although terms such as "first" and "second" are used herein to describe various elements, these elements should not be limited by these terms. The terms are used to distinguish one component from other components. For example, a first element referred to as a "first" element in one embodiment may be referred to as a "second" element in another embodiment without departing from the scope of the appended claims. The terms of a singular form may include plural forms unless stated to the contrary.

The meaning of "include," "comprise," "including," or "comprising," specifies features, integers, steps, operations, elements, components, or combinations thereof listed in the specification, but does not exclude other features, integers, steps, operations, elements, components, or combinations thereof.

Figure 2:
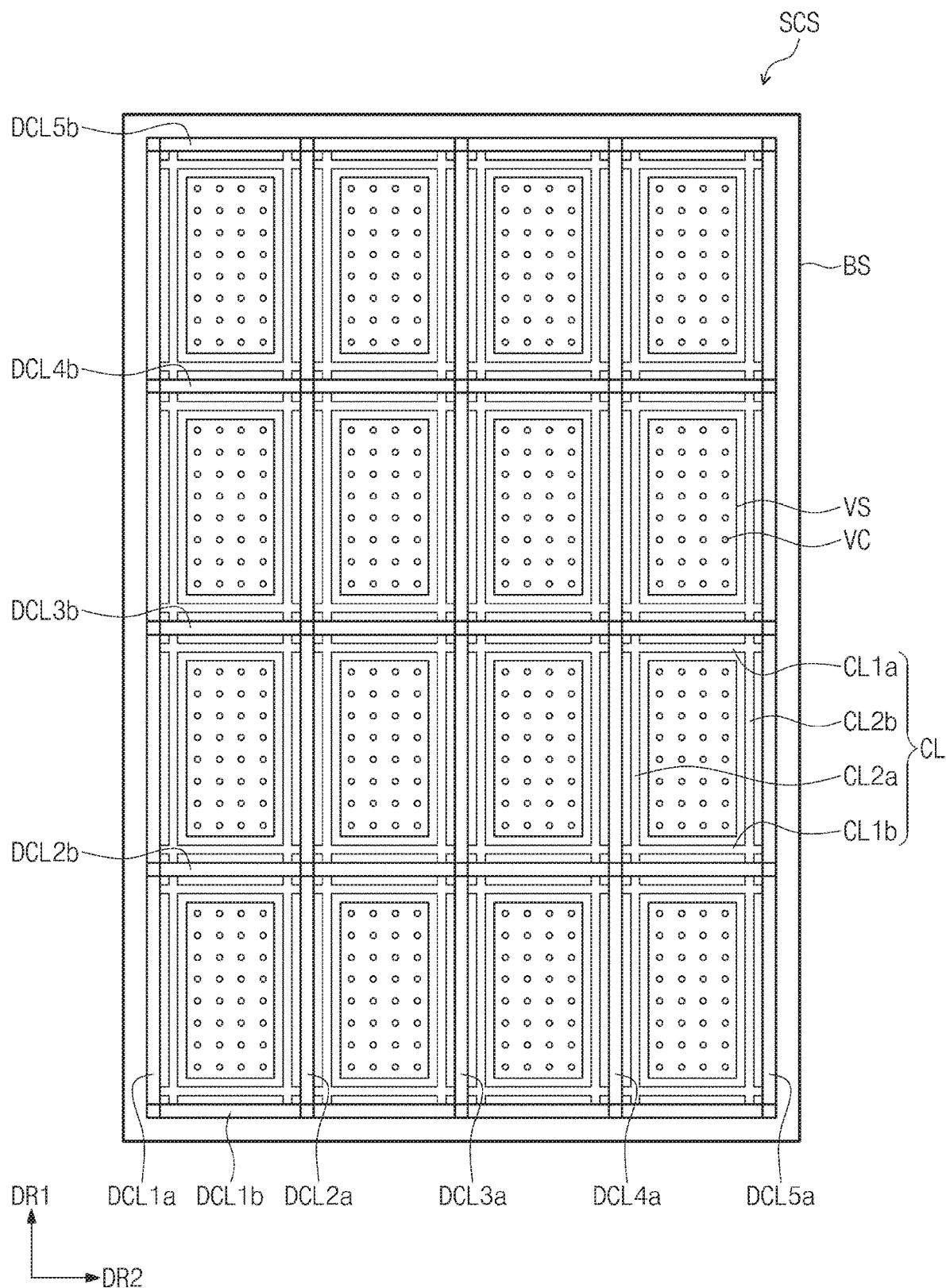
FIG. 2 is a plan view illustrating a stage for cutting a substrate according to an embodiment of the inventive concept.

FIG. 1 is a perspective view illustrating a substrate cutting device according to an embodiment of the inventive concept. FIG. 2 is a plan view of a state for cutting a substrate according to an embodiment of the inventive concept.

Referring to FIG. 1, a substrate cutting device SCD according to an embodiment includes a stage for cutting a substrate SCS (herein, referred to as a substrate cutting stage), a laser module LR, and a control unit CT.

In an embodiment, the substrate cutting stage SCS includes a body member BS, a suction line SL, a suction device SD, an air supply line AL, and an air supply device AD.

The body member BS may support a mother substrate MS. The body member BS is parallel to a surface defined by a first direction DR1 and a second direction DR2. A direction of a normal line of the body member BS indicates a third direction DR3. The third direction DR3 indicates a thickness direction of the body member BS. Front and rear surfaces of each of members according to an embodiment of the inventive concept are distinguished by the third direction DR3. However, directions indicated by the directions DR1 to DR3, as a relative concept, may be varied with respect to each other.

The mother substrate MS may be disposed or arranged on the body member BS. The mother substrate MS may be cut by the substrate cutting device SCD and divided into a plurality of display modules. Here, each of the display modules may include at least one of a display panel for displaying an image and an input sensing unit for sensing an external input. Also, a plurality of cell areas may be defined on the body member BS, and the plurality of cell areas may overlap the plurality of display modules, respectively. The plurality of cell areas may have a matrix shape.

The suction line SL extends in the first direction DR1 and is arranged in the second direction DR2. The suction line SL has one end connected to a side surface of the body member BS and the other end connected to the suction device SD. The suction line SL may be connected to a discharging member inserted into the body member BS. The discharging member will be explained in further detail with reference to FIGS. 2 to 3.

The suction device SD may be connected to the suction line SL and may suction foreign substances generated while the mother substrate MS is cut. The foreign substances may include fumes or particles, which may be generated while the mother substrate MS is cut. A number of the suction devices SD may correspond one-to-one to a number of the suction lines SL. That is, the suction devices SD may be provided in a number equal to the number of the suction lines SL arranged in the second direction DR2.

The foreign substances generated while the mother substrate MS is cut may be stacked on the discharging member inserted into the body member BS, and the suction device SD may suction the air or the foreign substances, which are stacked on the discharging member, through the suction line SL connected to the discharging member. In an embodiment, the suction device SD may include a solenoid valve (not shown) adjusting a degree of opening, a vacuum pump (not shown) providing a suction force, and a collector (not shown) storing the collected foreign substances.

The air supply line AL extends in the first direction DR1 and is arranged in the second direction DR2. In an embodiment, the air supply line AL and the suction line SL are alternately arranged in the second direction DR2. The air supply line AL has one end connected to the side surface, to which the suction line SL is connected, of side surfaces of the body member BS and the other end connected to the air supply device AD. The air supply line AL may be connected to a supply pipe inserted into the body member BS. The supply pipe will be explained in further detail with reference to FIGS. 2 to 3.

Herein, according to an embodiment of the inventive concept, the pipe refers to a member including an inner space through which air may be circulated.

The air supply device AD may be connected to the air supply line AL to inject air into the air supply line AL. As air is injected into the air supply line AL by the air supply device AD, the air may be also injected into the supply pipe connected to the air supply line AL.

The laser module LR may include a laser beam generation part (not shown) emitting a laser and an optical system installed on a laser path. In an embodiment, the laser beam generation part may include any of a solid laser such as a ruby laser, a glass laser, an yttrium aluminum garnet (YAG) laser, and an yttrium lithium fluoride (YLF) laser, a gas laser such as an excimer laser and a helium-neon (He—Ne) laser, and a pulsed laser.

The optical system may be disposed on a traveling path of a laser generated from the laser beam generation part. The optical system may include a homogenizer for homogenizing a shape of a laser or a condensing lens for focusing a laser beam. Also, the optical system may include at least one mirror (not shown) installed on the laser path to convert an angle of the laser. In an embodiment, the mirror includes a galvano mirror or a reflection mirror, which may linearly change an angle thereof on the basis of variation of an input voltage.

The control unit CT may control a position of the laser module LR or an intensity and a size of an outputted laser. The control unit CT may move the position of the laser module LR such that the laser is irradiated to the mother substrate MS along first and second cutting areas CA1 and CA2 of the body member BS. The laser module LR may move in the first direction DR1 and the second direction DR2.

In an embodiment, the control unit CT may adjust the intensity of the laser such that the laser has an intensity sufficient to cut the mother substrate MS. The control unit CT may control the size and intensity of the laser oscillated from the laser beam generation part according to a preset intensity or size of the laser or the intensity or size of the laser, which is input by a worker.

Referring to FIG. 2, in an embodiment, the substrate cutting stage SCS further includes a plurality of first discharging members DCL1a to DCL5a, a plurality of second discharging members DCL1b to DCL5b, a plurality of connecting pipes CL, and a plurality of vacuum stages VS.

According to an embodiment of the inventive concept, five first discharging members DCL1a to DCL5a and five second discharging members DCL1b to DCL5b are provided, and sixteen cell areas that are divided by the first discharging members DCL1a to DCL5a and the second discharging members DCL1b to DCL5b may be defined on the body member BS. Here, each of the cell areas may be an area surrounded by two first discharging members adjacent to each other and two second discharging members adjacent to each other.

However, although it is described for convenience of description that the number of each of the first discharging members and the second discharging members is five, embodiments of the inventive concept are not limited thereto. For example, a plurality of first discharging members and a plurality of second discharging members may be disposed on the body member BS.

The first discharging members DCL1a to DCL5a and the second discharging members DCL1b to DCL5b may cross each other.

The first discharging members DCL1a to DCL5a may extend in the first direction DR1 and be arranged by a distance (e.g., a predetermined distance) in the second direction DR2. The first discharging members DCL1a to DCL5a may overlap the first cutting areas CA1 shown in FIG. 1, respectively. That is, when the laser is irradiated to the mother substrate MS along the first cutting areas CA1, the foreign substances generated in the process of cutting the mother substrate MS may be transferred to the first discharging members DCL1a to DCL5a.

In particular, ends of the first discharging members DCL1a to DCL5a may be connected to the plurality of suction lines SL that are shown in FIG. 1, respectively. As the suction devices SD connected to the suction lines SL, respectively, perform suction, the foreign substances stacked on the first discharging members DCL1a to DCL5a may be suctioned to each of the suction devices SD through the suction lines SL.

According to an embodiment, the first discharging members DCL1a to DCL5a may be separated from the body member BS. Accordingly, the foreign substances stacked in the first discharging members DCL1a to DCL5a may be removed by an external device.

The second discharging members DCL1b to DCL5b may be arranged by a distance (e.g., a predetermined distance) in the first direction DR1 and extend in the second direction DR2. The second discharging members DCL1b to DCL5b may overlap the second cutting areas CA2 shown in FIG. 1, respectively. That is, when the laser is irradiated to the mother substrate MS along the second cutting areas CA2, the foreign substances generated in the process of cutting the mother substrate MS may be transferred to the second discharging members DCL1b to DCL5b.

In an embodiment, the second discharging members DCL1b to DCL5b are not additionally connected to the suction devices SD. Also, the second discharging members DCL1b to DCL5b may not be separated from the body member BS. As a result, the foreign substances stacked on the second discharging members DCL1b to DCL5b may not be sufficiently suctioned by the suction devices SD in comparison with those on the first discharging members DCL1a to DCL5a.

According to an embodiment of the inventive concept, the connecting pipes CL may be disposed on the body member BS to overlap the cell areas, respectively. In an embodiment, sixteen connecting pipes CL corresponding to the sixteen cell areas may be disposed on the body member BS. Each of the connecting pipes CL may include first to fourth connecting pipes CL1a, CL1b, CL2a, and CL2b, through which air is circulated.

The first and second connecting pipes CL1a and CL1b may be spaced apart from each other in the first direction DR1. Each of the first and second connecting pipes CL1a and CL1b may be connected to two discharging members that are adjacent to each other among the first discharging members DCL1a to DCL5a.

The third and fourth connecting pipes CL2a and CL2b are spaced apart from each other in the second direction DR2. Each of the third and fourth connecting pipes CL2a and CL2b may be connected to two discharging members that are adjacent to each other among the second discharging members DCL1b to DCL5b.

In an embodiment, at least one connecting pipe of the first to fourth connecting pipes CL1a, CL1b, CL2a, and CL2b may be connected to the air supply line AL shown in FIG. 1. Accordingly, the air supplied from the air supply device AD may be transferred to the first to fourth connecting pipes CL1a, CL1b, CL2a, and CL2b through the air supply line AL. The air supplied to the first to fourth connecting pipes CL1a, CL1b, CL2a, and CL2b may be transferred to two first discharging members adjacent thereto and two second discharging members adjacent thereto.

In an embodiment, as the air is injected into the second discharging members, the foreign substances stacked on the second discharging members may move toward the first discharging members by the injected air. As a result, the foreign substances stacked on the second discharging members may be more easily suctioned by the suction devices SD.

A plurality of vacuum stages VS may be disposed on the body member BS to overlap the plurality of cell areas, respectively. In an embodiment, sixteen vacuum stages VS corresponding to the sixteen cell areas may be disposed on the body member BS. On a plane, each of the vacuum stages VS may be surrounded by the first to fourth connecting pipes CL1a, CL1b, CL2a, and CL2b.

The vacuum stages VS may support the mother substrate MS and prevent or substantially prevent movement of the mother substrate MS. In an embodiment, each of the vacuum stages VS may include a plurality of vacuum holes VC. Although not shown, each of the vacuum stages VS may be connected to an external vacuum pump. As a result, the mother substrate MS may be fixed to the vacuum holes VC through a suction operation of the external vacuum pump.

Figure 3:
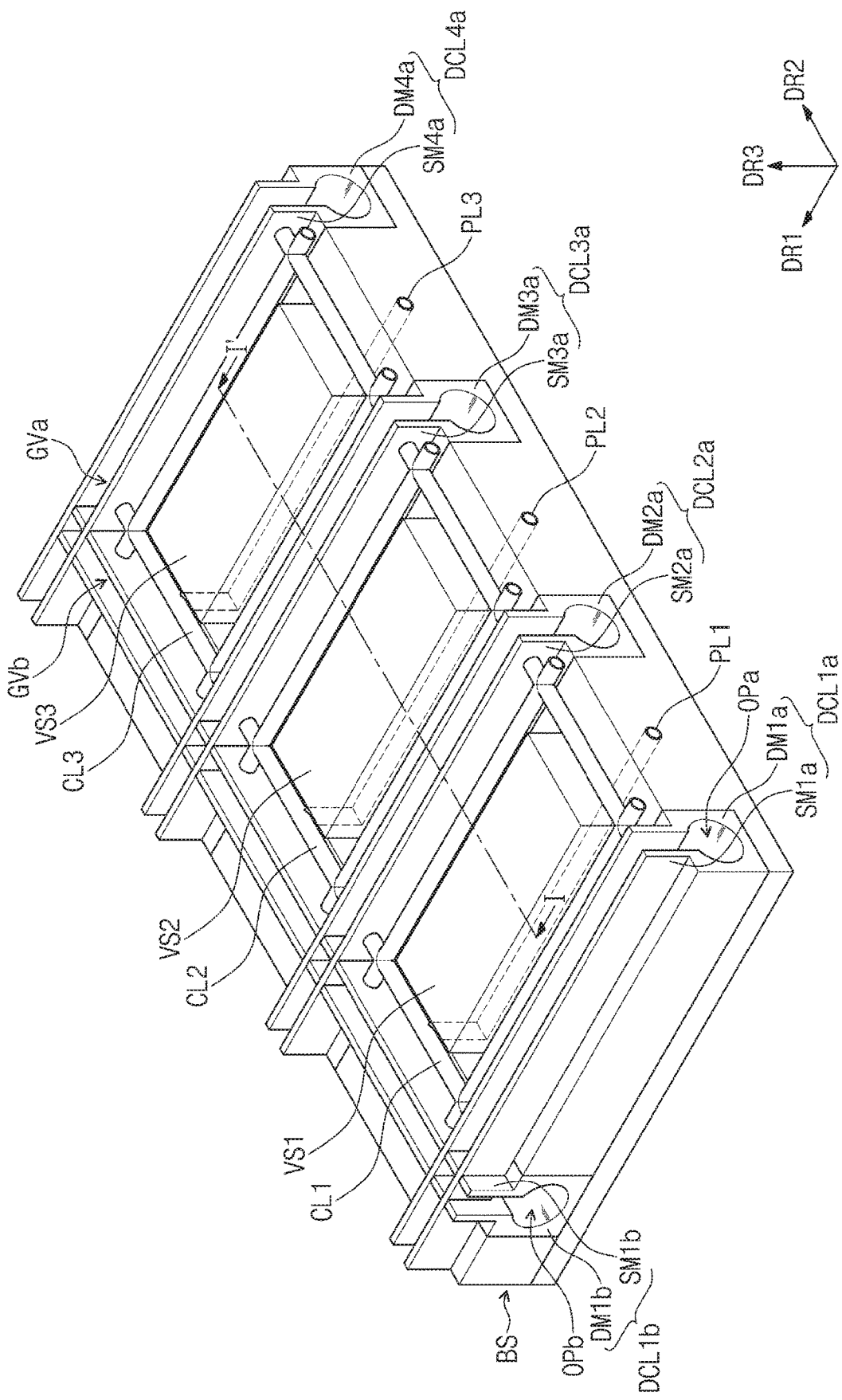
FIG. 3 is a perspective view illustrating a portion of cell areas of a stage for cutting a substrate according to an embodiment of the inventive concept.
Figure 4:
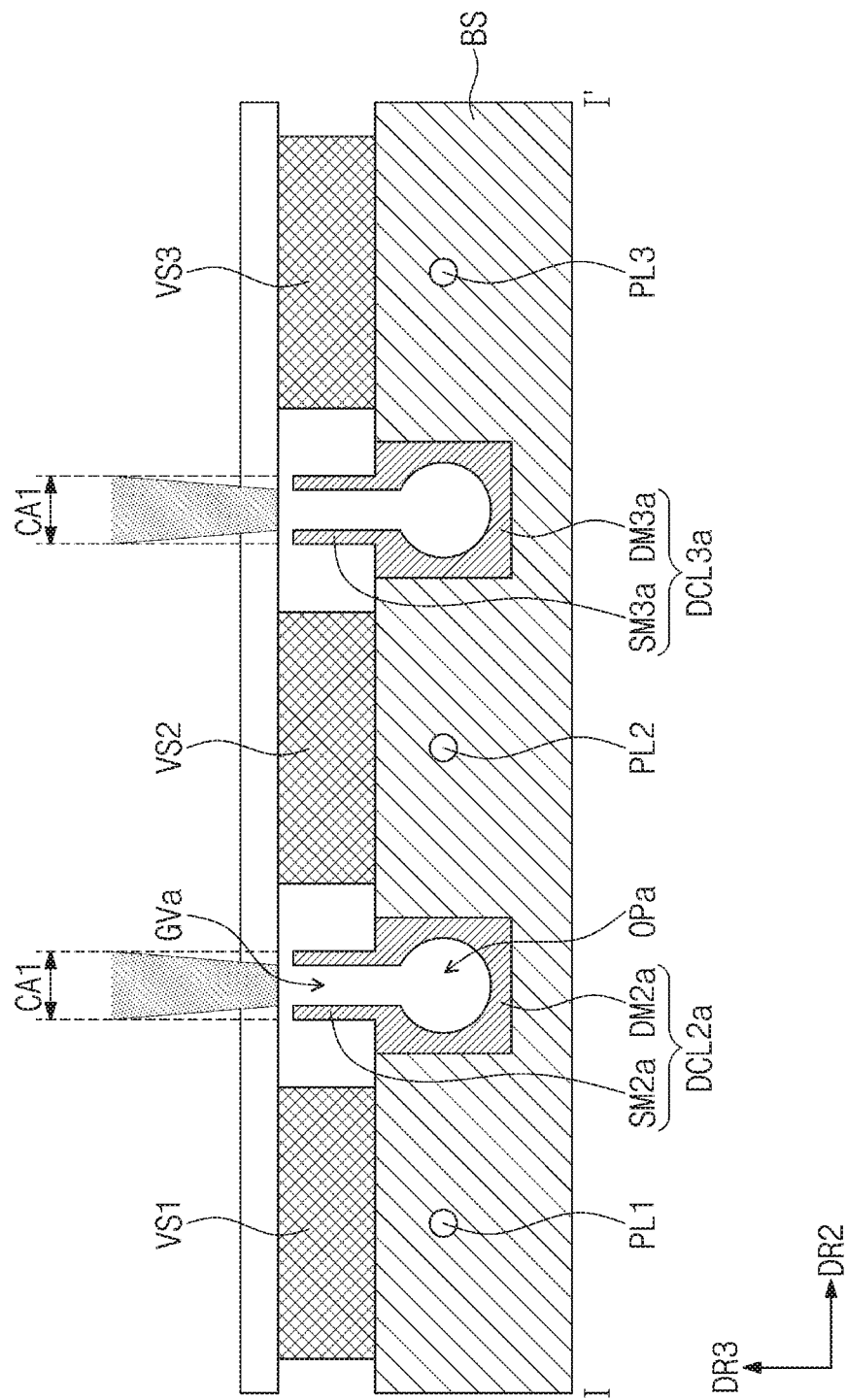
FIG. 4 is a cross-sectional view taken along the line I-I' of FIG. 3.
Figure 5:
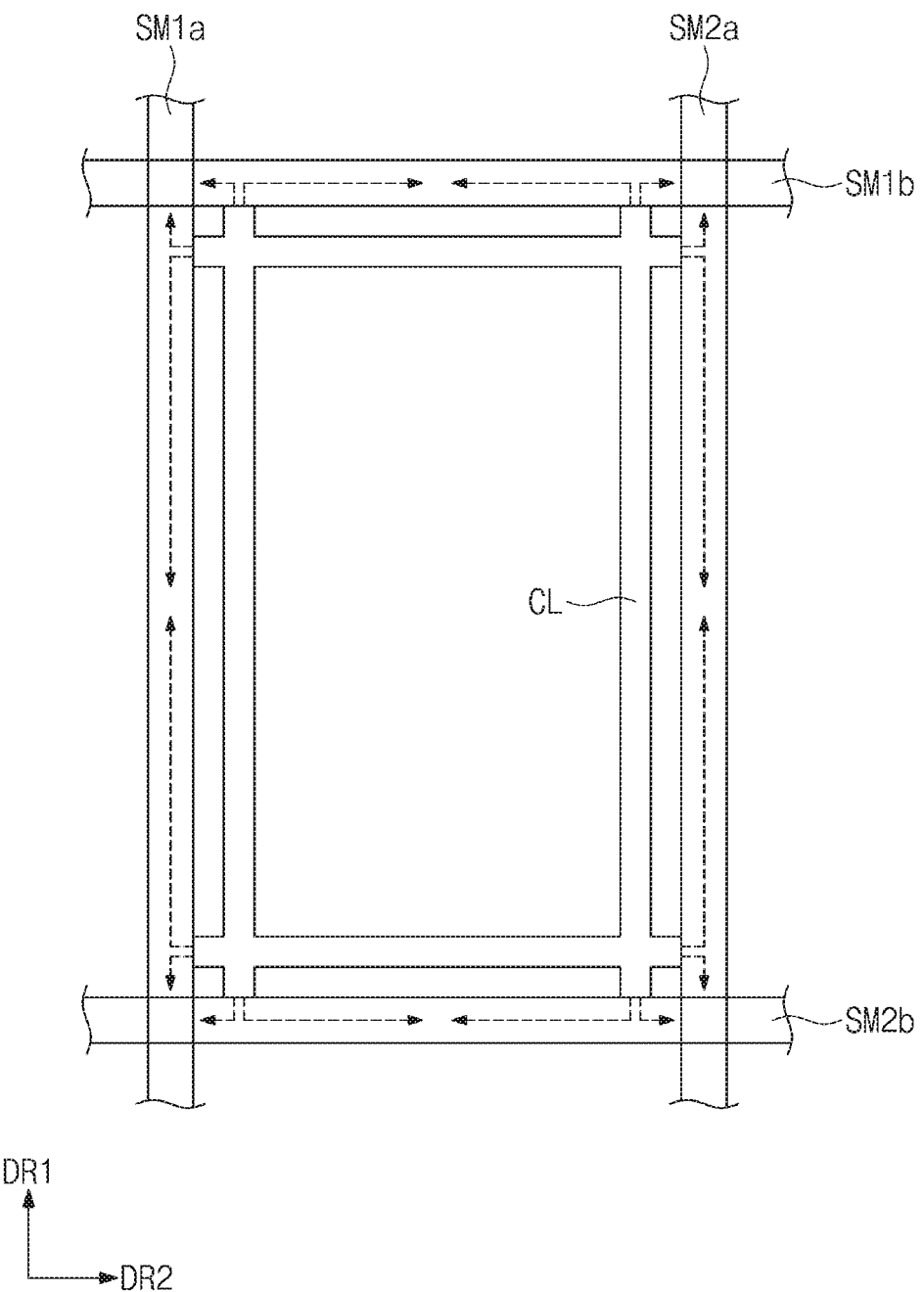
FIG. 5 is a view showing an example of air circulation through discharging members according to an embodiment of the inventive concept.

FIG. 3 is a perspective view illustrating a portion of the cell areas of the substrate cutting stage according to an embodiment; FIG. 4 is a cross-sectional view taken along the line I-I' of FIG. 3; and FIG. 5 is a view showing an example of air circulation through the discharging members according to an embodiment of the inventive concept.

Referring to FIGS. 3 and 4, three cell areas from among the plurality of cell areas defined in the body member BS in FIG. 2 are exemplarily illustrated. Herein, according to the illustration of FIGS. 3 and 4, the substrate cutting stage SCS includes the body member BS, the first discharging members DCL1a to DCL4a, the second discharging member DCL1b, first to third vacuum stages VS1 to VS3 from among the plurality of vacuum stages VS, and first to third connecting pipes CL1 to CL3 from among the plurality of connecting pipes CL.

The first discharging member DCL1a of the first discharging members DCL1a to DCL4a includes a first suction portion DM1a and a first partition wall portion SM1a. The first suction portion DM1a may be inserted in the body member BS while extending in the first direction DR1 and have a first inner space OPa. The first suction portion DM1a may have an end connected to the suction line SL that is shown in FIG. 1.

The first partition wall portion SM1a may be disposed on the body member BS and connected to the first suction portion DM1a. The first partition wall portion SM1a may extend in the first direction DR1 and include a first opening GVa connected to the first inner space OPa of the first suction portion DM1a. The first partition wall portion SM1a may include a first partition wall and a second partition wall, which are spaced apart from each other with the first opening GVa therebetween. The first opening GVa may have a shape extending in the first direction DR1.

According to an embodiment of the inventive concept, the first inner space OPa and the first opening GVa, which are defined in the first discharging member DCL1a, may have one opening shape connected to the outside space, and, herein, the one opening shape is referred to as a first space. Accordingly, the foreign substances generated while the mother substrate MS is cut may be transferred to the first suction portion DM1a through the first opening GVa.

Herein, according to an embodiment of the inventive concept, each of the first to fourth partition wall portions SM1a to SM4a includes the first opening GVa.

The second discharging member DCL2a of the first discharging members DCL1a to DCL4a includes a second suction portion DM2a and a second partition wall portion SM2*a*. The second suction portion DM2*a* may be inserted in the body member BS while extending in the first direction DR1 and have a first inner space OPa. Likewise, the second suction portion DM2*a* may have an end connected to the suction line SL that is shown in FIG. 1.

The second partition wall portion SM2*a* may be disposed on the body member BS and connected to the second suction portion DM2*a*. The second partition wall portion SM2*a* may extend in the first direction DR1 and include a first opening GVa connected to the first inner space OPa of the second suction portion DM2*a*. The second partition wall portion SM2*a* may include a first partition wall and a second partition wall, which are spaced apart from each other with the first opening GVa therebetween. Accordingly, the foreign substances generated while the mother substrate MS is cut may be transferred to the second suction portion DM2*a* through the first opening GVa.

The third discharging member DCL3*a* of the first discharging members DCL1*a* to DCL4*a* includes a third suction portion DM3*a* and a third partition wall portion SM3*a*. The third suction portion DM3*a* may be inserted in the body member BS while extending in the first direction DR1 and have a first inner space OPa. Likewise, the third suction portion DM3*a* may have an end connected to the suction line SL that is shown in FIG. 1.

The third partition wall portion SM3*a* may be disposed on the body member BS and connected to the third suction portion DM3*a*. The third partition wall portion SM3*a* may extend in the first direction DR1 and include a first opening GVa connected to the first inner space OPa of the third suction portion DM3*a*. The third partition wall portion SM3*a* may include a first partition wall and a second partition wall, which are spaced apart from each other with the first opening GVa therebetween. Accordingly, the foreign substances generated while the mother substrate MS is cut may be transferred to the third suction portion DM3*a* through the first opening GVa.

The fourth discharging member DCL4*a* of the first discharging members DCL1*a* to DCL4*a* includes a fourth suction portion DM4*a* and a fourth partition wall portion SM4*a*. The fourth suction portion DM4*a* may be inserted in the body member BS while extending in the first direction DR1 and have a first inner space OPa. Likewise, the fourth suction portion DM4*a* may have an end connected to the suction line SL that is shown in FIG. 1.

The fourth partition wall portion SM4*a* may be disposed on the body member BS and connected to the fourth suction portion DM4*a*. The fourth partition wall portion SM4*a* may extend in the first direction DR1 and include a first opening GVa connected to the first inner space OPa of the fourth suction portion DM4*a*. The fourth partition wall portion SM4*a* may include a first partition wall and a second partition wall, which are spaced apart from each other with the first opening GVa therebetween. Accordingly, the foreign substances generated while the mother substrate MS is cut may be transferred to the fourth suction portion DM4*a* through the first opening GVa.

As described above, each of the first to fourth partition wall portions SM1*a* to SM4*a* that are included in the first discharging members DCL1*a* to DCL5*a* include the first partition wall and the second partition wall. In this case, the first partition wall includes at least one hole (not shown) for being connected to one connecting pipe of the plurality of connecting pipes CL in FIG. 2. The second partition wall may include at least one hole (not shown) that is connected to another connecting pipe adjacent to the one connecting pipe of the connecting pipes CL in the second direction DR2.

In an embodiment, each of first to fourth partition wall portions that are included in the second discharging members DCL1*b* to DCL5*b* includes a third partition wall and a fourth partition wall. In this case, the third partition wall includes at least one hole (not shown) for being connected to one connecting pipe of the plurality of connecting pipes CL. The second partition wall may include at least one hole (not shown) that is connected to another connecting pipe adjacent to the one connecting pipe of the connecting pipes CL in the first direction DR1.

The second discharging member DCL1*b* includes a first suction portion DM1*b* and a first partition wall portion SM1*b*. The first suction portion DM1*b* may be inserted in the body member BS while extending in the second direction DR2 and have a second inner space OPb. The first suction portion DM1*b* may cross each of the first to fourth suction portions DM1*a* to DM4*a*. A region in which the first suction portion DM1*b* and the first to fourth suction portions DM1*a* to DM4*a* cross each other may have an opening shape such that air or foreign substances are circulated through all of the first suction portion DM1*b* and the first to fourth suction portions DM1*a* to DM4*a*.

The first partition wall portion SM1*b* may be disposed on the body member BS and connected to the first suction portion DM1*b*. The first partition wall portion SM1*b* may extend in the second direction DR2 and include a second opening GVb connected to the second inner space OPb of the first suction portion DM1*b*. The first partition wall portion SM1*b* may include a third partition wall and a fourth partition wall, which are spaced apart from each other with the second opening GVb therebetween. The second opening GVb may have a shape extending in the second direction DR2.

According to an embodiment of the inventive concept, the second inner space OPb and the second opening GVb, which are defined in the second discharging member DCL1*b* may have one opening shape connected to the outside space, and, herein, the one opening shape is referred to as a second space. Accordingly, the foreign substances generated while the mother substrate MS is cut may be transferred to the first suction portion DM1*b* through the second opening GVb.

The first vacuum stage VS1 and the first connecting pipe CL1 are disposed between the first discharging member DCL1*a* and the second discharging member DCL2*a*. The first connecting pipe CL1 may include the first to fourth connecting pipes CL1*a*, CL1*b*, CL2*a*, and CL2*b* that are shown in FIG. 2. On a plane, the first vacuum stage VS1 may be surrounded by the first connecting pipe CL1. The first connecting pipe CL1 may be connected to each of the first partition wall portion SM1*a*, the second partition wall portion SM2*a*, and the first partition wall portion SM1*b*. Although not shown, the first connecting pipe CL1 may be further connected to a second partition wall portion SM2*b* (see FIG. 5) that is spaced apart from the first partition wall portion SM1*b*.

The first connecting pipe CL1 may be connected to a first supply pipe PL1 inserted in the body member BS. At least one portion of the first connecting pipe CL1 may have an opening shape to which air is injected from the first supply pipe PL1, and the first supply pipe PL1 may be connected thereto according to the shape of the opening. Although the first supply pipe PL1 is inserted in the body member BS, a portion of the first supply pipe PL1, which is connected to the first connecting pipe CL1, may be disposed on the body member BS.

The first supply pipe PL1 may be connected to the air supply line AL that is shown in FIG. 1. The air supplied from the air supply device AD may be transferred to the first supply pipe PL1 through the air supply line AL.

As a result, as illustrated in FIG. 5, air may be injected into the first connecting pipe CL1 connected to the first supply pipe PL1. The first connecting pipe CL1 may transfer air to each of the first openings GVa of the first partition wall portion SM1a and the second partition wall portion SM2a. As a result, the foreign substances stacked inside the first partition wall portion SM1a and inside the second partition wall portion SM2a may fall towards the first suction portion DM1a and the second suction portion DM2a, respectively. Accordingly, the foreign substances stacked inside the first partition wall portion SM1a and the second partition wall portion SM2a may be easily removed.

Also, the first connecting pipe CL1 may transfer air to each of the second openings GVb of the first partition wall portion SM1b and the second partition wall portion SM2b. As a result, the foreign substances stacked inside the first partition wall portion SM1b and inside the second partition wall portion SM2b may fall towards the first suction portion DM1b and the second suction portion (not shown), respectively.

The second vacuum stage VS2 and the second connecting pipe CL2 are disposed between the second discharging member DCL2a and the third discharging member DCL3a. The second connecting pipe CL2 may include the first to fourth connecting pipes CL1a, CL1b, CL2a, and CL2b. On a plane, the second vacuum stage VS2 may be surrounded by the second connecting pipe CL2. The second connecting pipe CL2 may be connected to each of the second partition wall portion SM2a, the third partition wall portion SM3a, and the first partition wall portion SM1b. Although not shown, the second connecting pipe CL2 may be further connected to the second partition wall portion SM2b that is spaced apart from the first partition wall portion SM1b. The second connecting pipe CL2 may be connected to a second supply pipe PL2 inserted in the body member BS. At least one portion of the second connecting pipe CL2 may have an opening shape to which air is injected from the second supply pipe PL2, and the second supply pipe PL2 may be connected thereto according to the shape of the opening. Although the second supply pipe PL2 is inserted in the body member BS, a portion of the second supply pipe PL2, which is connected to the second connecting pipe CL2, may be disposed on the body member BS.

The second supply pipe PL2 may be connected to the air supply line AL. The air supplied from the air supply device AD may be transferred to the second supply pipe PL2 through the air supply line AL. As a result, air may be injected into the second connecting pipe CL2 connected to the second supply pipe PL2.

A connection structure between the second connecting pipe CL2 and the second and third partition wall portions SM2a and SM3a may be substantially the same as that between the first connecting pipe CL1 and the first and second partition wall portions SM1a and SM2a, and, thus, repeated description thereof will be omitted.

The third vacuum stage VS3 and the third connecting pipe CL3 are disposed between the third discharging member DCL3a and the fourth discharging member DCL4a. The third connecting pipe CL3 may include the first to fourth connecting pipes CL1a, CL1b, CL2a, and CL2b. On a plane, the third vacuum stage VS3 may be surrounded by the third connecting pipe CL3. The third connecting pipe CL3 may be connected to each of the third partition wall portion SM3a, the fourth partition wall portion SM4a, and the first partition wall portion SM1b. Although not shown, the third connecting pipe CL3 may be further connected to the second partition wall portion SM2b that is spaced apart from the first partition wall portion SM1b.

The third connecting pipe CL3 may be connected to a third supply pipe PL3 inserted in the body member BS. At least one portion of the third connecting pipe CL3 may have an opening shape to which air is injected from the third supply pipe PL3, and the third supply pipe PL3 may be connected thereto according to the shape of the opening. Although the third supply pipe PL3 is inserted in the body member BS, a portion of the third supply pipe PL3, which is connected to the third connecting pipe CL3, may be disposed on the body member BS.

The third supply pipe PL3 may be connected to the air supply line AL. The air supplied from the air supply device AD may be transferred to the third supply pipe PL3 through the air supply line AL. As a result, air may be injected into the third connecting pipe CL3 connected to the third supply pipe PL3.

According to an embodiment, each of the first to third supply pipes PL1 to PL3 may be disposed between two discharging members that are adjacent to each other among the first discharging members DCL1a to DCL5a.

A connection structure between the third connecting pipe CL3 and the third and fourth partition wall portions SM3a and SM4a may be substantially the same as that between the first connecting pipe CL1 and the first and second partition wall portions SM1a and SM2a, and, thus, repeated description thereof will be omitted.

As illustrated in FIG. 4, in the third direction DR3, each of the vacuum stages VS1 to VS3 may have a height greater than that of each of the partition wall portions SM2a and SM3a. Accordingly, in the third direction DR3, the mother substrate MS and the partition wall portions SM2a and SM3a may be spaced by a distance (e.g., a predetermined distance) from each other.

FIG. 4 is a view illustrating a state in which a laser is irradiated to the mother substrate MS along the first cutting areas CA1. In this case, the foreign substances may fall from the partition wall portions SM2a and SM3a by the laser irradiated to the mother substrate MS along the first cutting areas CA1.

Figure 6:
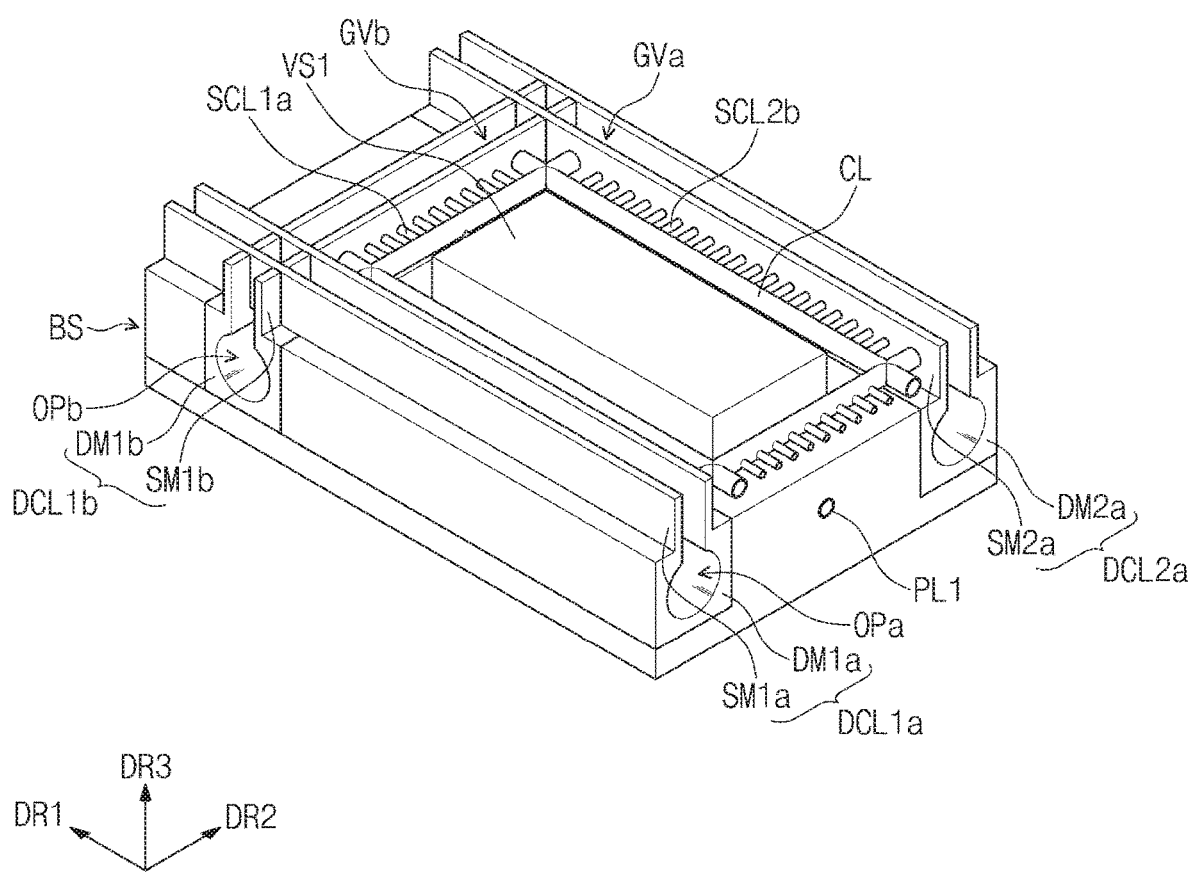
FIG. 6 is a perspective view illustrating a cell of a stage for cutting a substrate according to another embodiment of the inventive concept.
Figure 7:
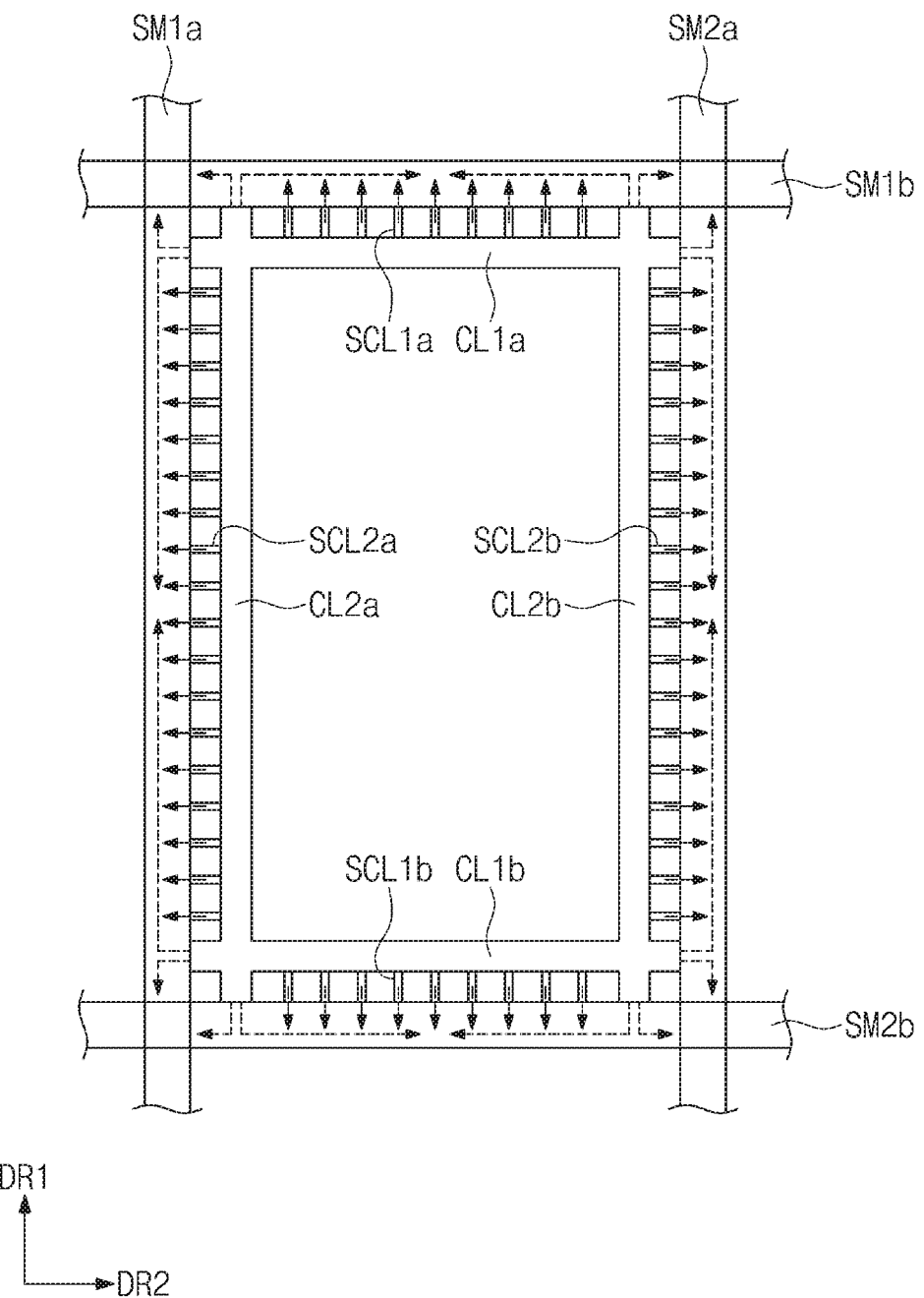
FIG. 7 is a view showing an example of air circulation through discharging members according to another embodiment of the inventive concept.

FIG. 6 is a perspective view illustrating a cell of a substrate cutting stage according to another embodiment of the inventive concept; and FIG. 7 is a view showing an example of air circulation through discharging members according to another embodiment of the inventive concept.

Referring to FIG. 6, one cell area of the plurality of cell areas defined in the body member BS in FIG. 2 is exemplarily illustrated. A substrate cutting stage shown in FIG. 6 may have a constitution that is substantially the same as that of the substrate cutting stage shown in FIG. 3, except that a plurality of sub-connecting pipes is further added. Thus, repeated description of the constitution except for the plurality of sub-connecting pipes will be omitted.

Referring to FIGS. 6 and 7, the connecting pipe CL includes the first to fourth connecting pipes CL1a, CL1b, CL2a, and CL2b.

The first connecting pipe CL1a is connected to each of the first partition wall portion SM1a and the second partition wall portion SM2a. Air may be circulated through the inner space of the first connecting pipe CL1a, the first opening GVa of the first partition wall portion SM1a, and the first opening GVa of the second partition wall portion SM2a.

According to an embodiment, the first connecting pipe CL1a and the first partition wall portion SM1b may be connected through a plurality of first sub-connecting pipes SCL1a. Accordingly, air may be injected into the first partition wall portion SM1b through the first sub-connecting pipes SCL1a connected to the first connecting pipe CL1a.

According to an embodiment, the second connecting pipe CL1b and the second partition wall portion SM2b may be connected through a plurality of second sub-connecting pipes SCL1b. Accordingly, air may be injected into the second partition wall portion SM2b through the second sub-connecting pipes SCL1b connected to the second connecting pipe CL1b.

According to an embodiment, the third connecting pipe CL2a and the first partition wall portion SM1a may be connected through a plurality of third sub-connecting pipes SCL2a. Accordingly, air may be injected into the first partition wall portion SM1a through the third sub-connecting pipes SCL2a connected to the third connecting pipe CL2a.

According to an embodiment, the fourth connecting pipe CL2b and the second partition wall portion SM2a may be connected through a plurality of fourth sub-connecting pipes SCL2b. Accordingly, air may be injected into the second partition wall portion SM2a through the fourth sub-connecting pipes SCL2b connected to the fourth connecting pipe CL2b.

Air may be equally or substantially equally supplied to the inner areas of the first partition wall portions SM1a and SM1b and the second partition wall portions SM2a and SM2b through the first to fourth sub-connecting pipes SCL1a, SCL1b, SLC2a, and SCL2b.

Figure 8:
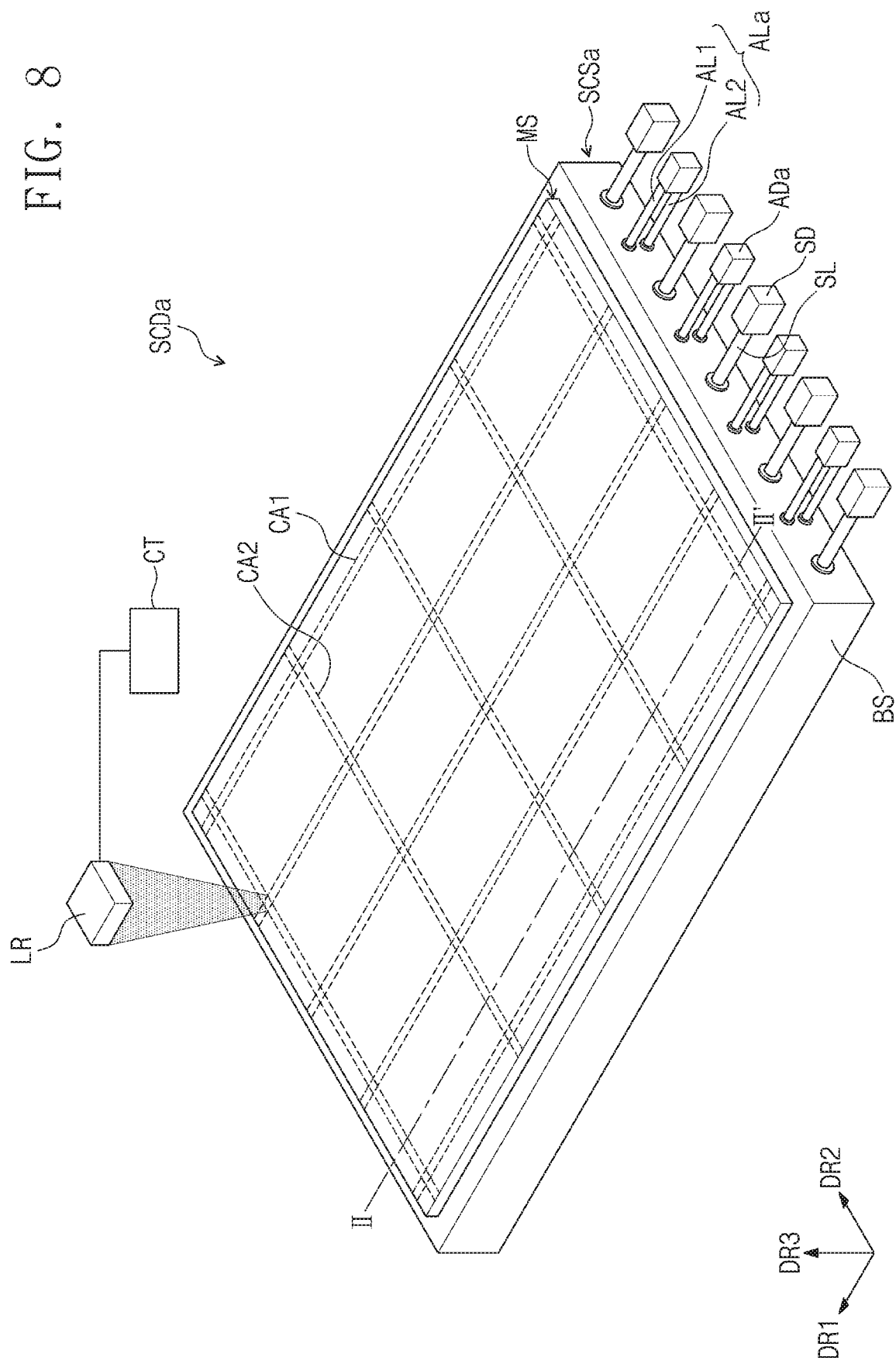
FIG. 8 is a perspective view illustrating a substrate cutting device according to another embodiment of the inventive concept.
Figure 9:
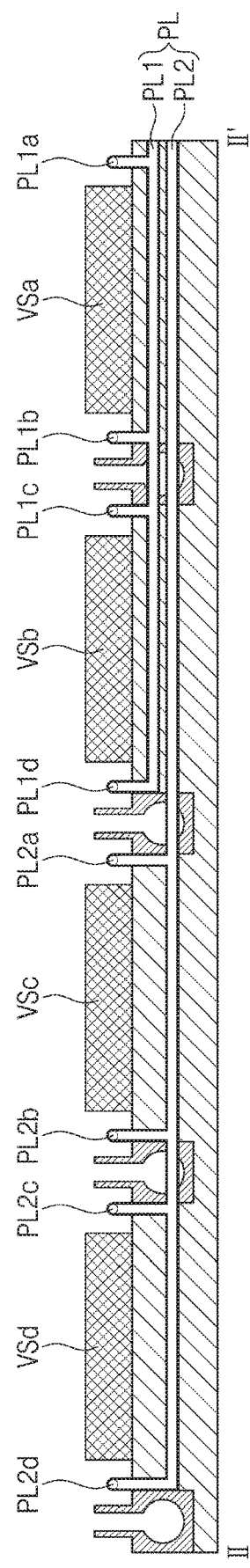
FIG. 9 is a cross-sectional view taken along the line II-II' of FIG. 8.

FIG. 8 is a perspective view illustrating a substrate cutting device SCDa according to another embodiment of the inventive concept; and FIG. 9 is a cross-sectional view taken along the line II-II' of FIG. 8;

A substrate cutting stage SCSa shown in FIG. 8 has a constitution that is substantially the same as that of the substrate cutting stage SCS shown in FIG. 1, except for a constitution of an air supply line and a supply pipe. Thus, repeated description of the constitution except for the air supply line and the supply pipe will be omitted.

Referring to FIG. 8, an air supply line ALa extends in the first direction DR1 and is arranged in the second direction DR2. The air supply line ALa may include a first air supply line AL1 and a second air supply line AL2. Each of the first air supply line AL1 and the second air supply line AL2 may be connected to an air supply device ADa and supplied with air.

Referring to FIG. 9, a supply pipe PL may include a first supply pipe PL1 connected to the first air supply line AL1 and a second supply pipe PL2 connected to the second air supply line AL2.

Herein, vacuum stages that are arranged in the first direction DR1 among vacuum stages are defined as a first stage group and a second stage group. The first stage group includes first and second vacuum stages VSa and VSb. The second stage group includes third and fourth vacuum stages VSc and VSd.

The connecting pipes arranged in the first direction DR1 among the connecting pipes are defined as a first connecting pipe group and a second connecting pipe group. The first connecting pipe group includes a first connecting pipe and a second connecting pipe, which surround the first and second vacuum stages VSa and VSb, respectively. The second connecting pipe group includes a third connecting pipe and a fourth connecting pipe, which surround the third and fourth vacuum stages VSc and VSd, respectively.

According to an embodiment of the inventive concept, the first supply pipe PL1 is connected to only the first and second connecting pipes that are included in the first connecting pipe group. In particular, the supply pipe PL further includes two first sub-supply pipes PL1a and PL1b connecting the first supply pipe PL1 to the first connecting pipe and two second sub-supply pipes PL1c and PL1d connecting the first supply pipe PL1 to the second connecting pipe.

According to an embodiment of the inventive concept, the second supply pipe PL2 is connected to only the third and fourth connecting pipes that are included in the second connecting pipe group. In particular, the supply pipe PL further includes two third sub-supply pipes PL2a and PL2b connecting the second supply pipe PL2 to the third connecting pipe and two fourth sub-supply pipes PL2c and PL2d connecting the second supply pipe PL2 to the fourth connecting pipe.

As described above, an intensity of the air supplied to each of the first connecting pipe group and the second connecting pipe group may be adjusted through the first supply pipe PL1 and the second supply pipe PL2.

Figure 10:
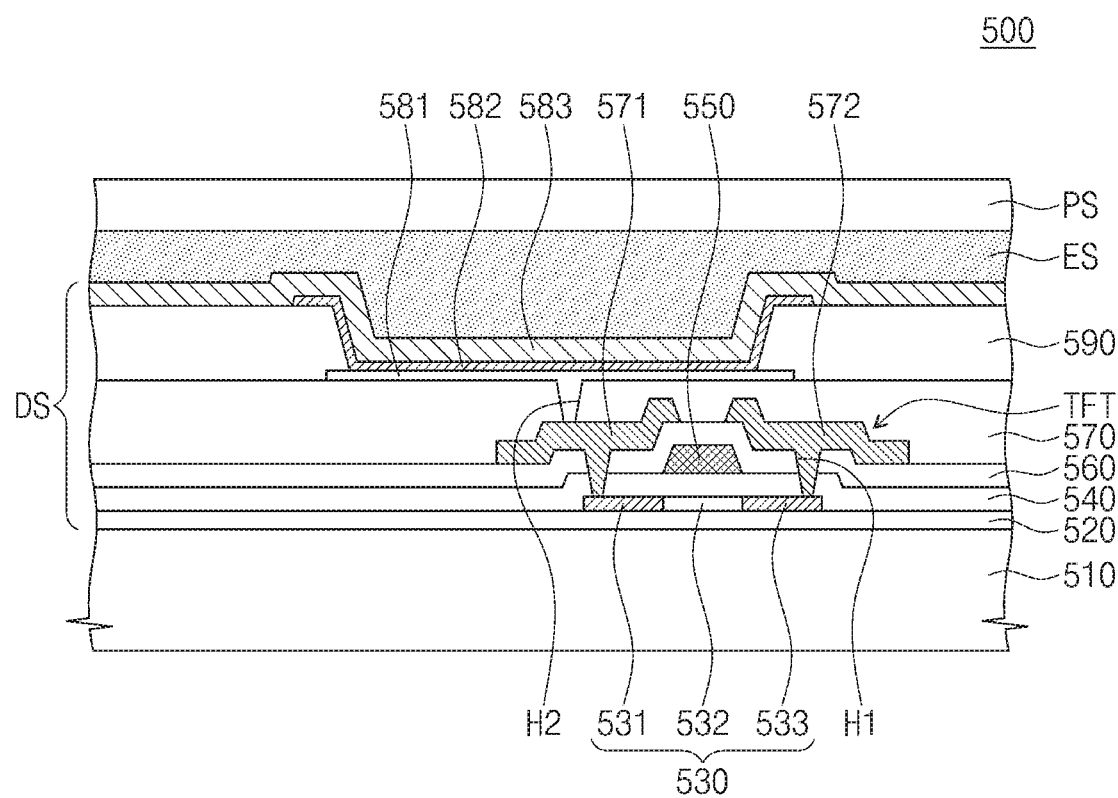
FIG. 10 is a cross-sectional view illustrating a portion of a display device manufactured by using the substrate cutting device according to an embodiment of the inventive concept.

FIG. 10 is a cross-sectional view illustrating a portion of a display device manufactured by using a substrate cutting device according to an embodiment of the inventive concept.

The display device in FIG. 10 may include at least one thin-film transistor TFT and an organic light emitting display device (OLED). The embodiment of the inventive concept is not limited to the structure of the thin-film transistor in FIG. 10. For example, the number and the structure of the thin-film transistor may be varied.

Referring to FIG. 10 a display device 500 may include a substrate 510, a display part DS, an encapsulation layer ES, and a protection layer PS. The substrate 510 may be made of a flexible insulating material. For example, the substrate 510 may be made from a polymer, such as polyimide (PI), polycarbonate (PC), polyether sulfone (PES), polyethylene terephthalate (PET), polyethylene naphthalate (PEN), polyarylate (PAR), or fiber glass reinforced plastic (FRP).

In an embodiment, the substrate 510 may be a glass substrate having a bendable thickness. The substrate 510 may be made of a metallic material. The substrate 510 may be transparent, translucent, or opaque. A buffer layer 520 that is made of an organic compound and/or an inorganic compound may be further formed on a top surface of the substrate 510.

The buffer layer 520 may block oxygen and moisture and allow a surface of the substrate 510 to be flat. In an embodiment, the buffer layer 520 may be made of one selected from an inorganic material, such as a silicon oxide (SiOx), a silicon nitride (SiNx), an aluminum oxide (AlOx), and an aluminum nitride (AlOxNy), and an organic material, such as acryl, polyimide, and polyester.

A thin film transistor TFT may be formed on the buffer layer 520. Although the thin film transistor may be a top gate transistor in an embodiment of the inventive concept, a thin film transistor having a different structure such as a bottom gate transistor may be provided.

An active layer 530 having a predetermined pattern is formed on the buffer layer 520, and then the active layer 530 is buried by a gate insulation layer 540. The active layer 530 includes a source area 531 and a drain area 533 and further includes a channel area 532 therebetween.

The active layer 530 may be formed to contain any of various materials. For example, the active layer 530 may contain an inorganic semiconductor material such as non-crystalline silicon or crystalline silicon. For another example, the active layer 530 may contain an oxide semiconductor. For example, the oxide semiconductor may include an oxide made of a material selected from the group consisting of metal elements of group 12, group 13, and group 14, such as hafnium (Hf), zinc (Zn), indium (In), gallium (Ga), tin (Sn), cadmium (Cd), and germanium (Ge) and a combination thereof.

Herein, the active layer 530 that is made of non-crystalline silicon will be mainly described for convenience of description.

A gate electrode 550 corresponding to the active layer 530 and an interlayer insulation layer 560 are formed on a top surface of the gate insulation layer 540.

A contact hole H1 is defined in the interlayer insulation layer 560 and the gate insulation layer 540, and then a source electrode 571 and a drain electrode 572, which contact the source area 531 and the drain area 533, respectively, are formed on the interlayer insulation layer 560.

A passivation film 570 is formed on the thin film transistor TFT that is formed as described above, and a pixel electrode 581 of the organic light emitting display device (OLED) is formed on the passivation film 570.

The pixel electrode 581 may be a (semi) transmissive electrode or a reflective electrode. The (semi) transmissive electrode may be made of, for example, an indium tin oxide (ITO), an indium zinc oxide (IZO), a zinc oxide (ZnO), an indium oxide ($In_2O_3$), an indium gallium oxide (IGO), or an aluminium zinc oxide (AZO). The reflective electrode may include a reflective film made of Ag, Mg, Al, Pt, Pd, Au, Ni, Nd, Ir, Cr or a combination thereof and a film made of ITO, IZO, ZnO, or In2O3. However, embodiments of the inventive concept are not limited to the constitution and material of the pixel electrode 581. The constitution and material of the pixel electrode 581 may be varied.

The pixel electrode 581 contacts the drain electrode 572 of the thin film transistor through a via hole H2 defined in the passivation film 570. The passivation film 570 may be made of an inorganic material and/or an organic material and formed as a single layer or two or more layers. The passivation film 570 may be formed to be curved along a curved shape of a film disposed therebelow or formed as a planarization film such that a top surface thereof is flattened regardless of the curved shape of the film disposed therebelow. In an embodiment, the passivation film 570 is formed as a transparent insulating body to achieve a resonance effect.

After the pixel electrode 581 is formed on the passivation film 570, a pixel defining film 590 is made of an organic material and/or an inorganic material to cover the pixel electrode 581 and the passivation film 570, and the pixel electrode 581 is opened to be exposed.

Also, at least an intermediate layer 582 and a counter electrode 583 are formed on the pixel electrode 581. The pixel electrode 581 serves as an anode electrode, and the counter electrode 583 serves as a cathode electrode. Here, the pixel electrode 581 and the counter electrode 583 may have polarities opposite to each other. The pixel electrode 581 and the counter electrode 583 may be insulated from each other by the intermediate layer 582, and voltages having polarities different from each other are applied to the intermediate layer 582 to allow an organic emission layer to emit light.

The intermediate layer 582 may include the organic emission layer. As another selective example, the intermediate layer 582 may include an organic emission layer and further include at least one of hole injection layer (HIL), a hole transport layer (HTL), an electron transport layer (ETL), and an electron injection layer (EIL).

Although a different light emitting material is used for each pixel of the organic emission layer in the above-described embodiment as an example, embodiments of the inventive concept are not limited thereto. For example, the organic emission layer may be formed in common for entire pixels regardless of the position of the pixel. Here, the organic emission layer may be formed in such a manner that layers containing light emitting materials emitting light of a red color, a green color, and a blue color are vertically laminated or mixed. Alternatively, the layer may have a different combination to emit white light.

Also, a color converting layer or a color filter, which converts the emitted white light into light having a predetermined color, may be further provided.

The display part DS may be formed on the substrate 510, and then an encapsulation layer ES may be formed on the display part DS. The encapsulation layer ES may include a plurality of inorganic layers or an inorganic layer and an organic layer.

A protective layer PS may be formed on the encapsulation layer ES. The protective layer PS may be formed through any of various methods. For example, the protective layer PS may be formed through any of a sputtering method, ion beam deposition, evaporation, and a general chemical vapor deposition method. The protective layer PS may include a metal-based oxide or nitride such as a silicon nitride (SiNx), nitride oxide silicon (SiOxNy), a titanium oxide (TIOx), nitride oxide titanium (TiOxNy), a zirconium oxide (ZrOx), a tantalum nitride (TaNx), a tantalum oxide (TaNx), a hafnium oxide (HfOx), and an aluminum oxide (AlOx).

In an embodiment, the protective layer PS may be formed to completely surround a side surface of the encapsulation layer ES. Accordingly, the protective layer PS may block the encapsulation layer ES from moisture or oxygen to increase a lifespan of the encapsulation layer ES.

The display device 500 may be applied to a flexible display device having flexibility and a display device having rigidity.

According to embodiments of the inventive concept, foreign substances stacked in the stage for cutting a substrate may be easily removed. Thus, the lifespan of the stage for cutting a substrate may be increased.

Herein, some embodiment have been disclosed in the drawings and the specification. While specific terms are used, they are not used to limit the meaning or the scope of the present invention described in the claims, but merely used to explain the present invention. Accordingly, a person having ordinary skill in the art will understand from the above that various modifications and other equivalent embodiments are also possible. Hence, the protective scope of the present invention shall be determined by the technical scope of the accompanying claims.

What is claimed is:

1. A stage for cutting a substrate, comprising:
   a body member on which a plurality of cell areas are defined;
   a plurality of vacuum stages on the body member, each of the vacuum stages overlapping a respective cell area of the plurality of cell areas;
   a plurality of first discharging members extending in a first direction and arranged by a distance from each other in a second direction crossing the first direction, each comprising a first suction portion in the body member and a first partition wall portion connected to the first suction portion and protruding from a top surface of the body member, each of the first discharging members defining a first space therein connected to an outside space;

a plurality of second discharging members extending in the second direction and arranged by a distance from each other in the first direction, each comprising a second suction portion in the body member and a second partition wall portion connected to the second suction portion and protruding from the top surface of the body member, each of the second discharging members defining a second space therein connected to the outside space;

a plurality of connecting pipes over the body member, each located so as to overlap a respective cell area of the plurality of cell areas, and each of the connecting pipes being connected to a first discharging member of the plurality of first discharging members through the first partition wall portion and being connected to a second discharging member of the plurality of second discharging members through the second partition wall portion; and a plurality of supply pipes connected to the connecting pipes and being in the body member and configured to supply air to each of the first spaces of the first discharging members and the second spaces of the second discharging members through the connecting pipes, wherein vacuum stages arranged in the first direction among the plurality of vacuum stages define a first vacuum stage group and a second vacuum stage group, and a first supply pipe of the plurality of supply pipes is connected to the connecting pipes located in the respective cell areas corresponding to the first vacuum stage group, and a second supply pipe of the plurality of supply pipes is connected to the connecting pipes located in the respective cell areas corresponding to the second vacuum stage group.

2. The stage of claim 1, wherein each of the connecting pipes comprises:

a first connecting pipe and a second connecting pipe, which are spaced apart from each other in the first direction and each of which is connected to two partition wall portions, which are adjacent to each other, among the first partition wall portions of the first discharging members; and a third connecting pipe and a fourth connecting pipe, which are spaced apart from each other in the second direction and each of which is connected to two partition wall portions, which are adjacent to each other, among the second partition wall portions of the second discharging members.

3. The stage of claim 2, wherein each of the supply pipes is connected to at least one of the third connecting pipe and the fourth connecting pipe.

4. The stage of claim 2, wherein air is circulated through all of the first to fourth connecting pipes.

5. The stage of claim 1, wherein, on a plane, each of the vacuum stages is surrounded by the first to fourth connecting pipes of a respective connecting pipe from among the plurality of connecting pipes that is located in the respective cell area of the plurality of cell areas.

6. The stage of claim 1, wherein, in a thickness direction of the body member, each of the vacuum stages has a height greater than that of each of the first partition wall portions and the second partition wall portions.

7. The stage of claim 1, wherein each of the vacuum stages comprises a plurality of vacuum holes.

8. The stage of claim 2, further comprising a plurality of first sub-connecting pipes connecting the first connecting pipe and one partition wall portion of the two partition wall portions, which is connected to the third connecting pipe and the fourth connecting pipe; and a plurality of second sub-connecting pipes connecting the second connecting pipe and the other partition wall portion of the two partition wall portions, which is connected to the third connecting pipe and the fourth connecting pipe.

9. The stage of claim 8, further comprising a plurality of third sub-connecting pipes connecting the third connecting pipe and one partition wall portion of the two partition wall portions, which is connected to the first connecting pipe and the second connecting pipe; and a plurality of fourth sub-connecting pipes connecting the fourth connecting pipe and the other partition wall portion of the two partition wall portions, which is connected to the first connecting pipe and the second connecting pipe.

10. The stage of claim 1, wherein the first partition wall portion comprises a first partition wall and a second partition wall, which are connected to the first suction portion and spaced apart from each other with the first space therebetween.

11. The stage of claim 10, wherein the first partition wall comprises at least one hole connected to a first connecting pipe of the connecting pipes, and the second partition wall comprises at least one hole connected to a second connecting pipe of the connecting pipes, which is adjacent to the first connecting pipe in the second direction.

12. The stage of claim 1, wherein the supply pipes extend in the first direction and are spaced a distance from each other in the second direction.

13. The stage of claim 12, wherein each of the supply pipes is connected to a respective connecting pipe of the plurality of connecting pipes through at least two areas.

14. The stage of claim 12, wherein each of the supply pipes is located between two discharging members, which are adjacent to each other, of the first discharging members.

* * * * *